(12) United States Patent
Xu et al.

(10) Patent No.: US 7,342,295 B2
(45) Date of Patent: Mar. 11, 2008

(54) POROGEN MATERIAL

(75) Inventors: Chongying Xu, New Milford, CT (US); Alexander S. Borovik, Hartford, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 53 days.

(21) Appl. No.: 11/071,621

(22) Filed: Mar. 3, 2005

(65) Prior Publication Data
US 2005/0161763 A1    Jul. 28, 2005

Related U.S. Application Data

(62) Division of application No. 10/301,109, filed on Nov. 21, 2002.

(51) Int. Cl.
*H01L 29/06* (2006.01)

(52) U.S. Cl. .............. 257/618; 257/E23.141; 257/E23.179; 257/E21.524

(58) Field of Classification Search .............. 257/618, 257/E23.141, E23.179, E21.524
See application file for complete search history.

(56) References Cited

U.S. PATENT DOCUMENTS

| | | | |
|---|---|---|---|
| 4,087,448 A | 5/1978 | Rossmy et al. |
| 4,127,598 A | 11/1978 | McEntee et al. |
| 4,156,689 A | 5/1979 | Ashby et al. |
| 4,374,110 A | 2/1983 | Darnell et al. |
| 4,670,299 A | 6/1987 | Fukuyama et al. |
| 4,745,169 A | 5/1988 | Sugiyama et al. |
| 4,755,370 A | 7/1988 | Kray et al. |
| 4,764,631 A | 8/1988 | Halm et al. |
| 4,871,616 A | 10/1989 | Kimura et al. |
| 5,043,789 A | 8/1991 | Linde et al. |
| 5,047,492 A | 9/1991 | Weidner et al. |
| 5,098,865 A | 3/1992 | Machado et al. |
| 5,204,314 A | 4/1993 | Kirlin et al. |
| 5,210,250 A | 5/1993 | Watanuki et al. |
| 5,276,173 A | 1/1994 | Marko et al. |
| 5,281,686 A | 1/1994 | Blohm et al. |
| 5,312,947 A | 5/1994 | Tsukuno et al. |
| 5,484,867 A | 1/1996 | Lichtenhan et al. |

(Continued)

FOREIGN PATENT DOCUMENTS

EP    0 543 665 A1    5/1993

(Continued)

OTHER PUBLICATIONS

Grill, Alfred, et al., Novel low-k dual-phase materials pepared by PECVD, Mat. Res. Soc. Symp. Proc., 2000, vol. 612.

(Continued)

*Primary Examiner*—Ngân V. Ngô
(74) *Attorney, Agent, or Firm*—Steven J. Hultquist; Intellectual Property/Technology Law; Maggie Chappuis

(57) ABSTRACT

A porogen material for forming a dielectric porous film. The porogen material may include a silicon based dielectric precursor and a silicon containing porogen. The porous film may have a substantially uniform dielectric constant value throughout. Methods of forming the porous film as well as semiconductor devices employing circuit features isolated by the porous film are also present.

9 Claims, 4 Drawing Sheets

U.S. PATENT DOCUMENTS

| | | | |
|---|---|---|---|
| 5,536,323 | A | 7/1996 | Kirlin et al. |
| 5,711,816 | A | 1/1998 | Kirlin et al. |
| 5,804,040 | A | 9/1998 | Asai et al. |
| 5,879,649 | A | 3/1999 | Henderson et al. |
| 6,114,500 | A | 9/2000 | Mori et al. |
| 6,147,009 | A | 11/2000 | Grill et al. |
| 6,171,945 | B1 | 1/2001 | Mandal et al. |
| 6,331,494 | B1 | 12/2001 | Olson et al. |
| 6,368,359 | B1 | 4/2002 | Perry et al. |
| 6,383,955 | B1 | 5/2002 | Matsuki et al. |
| 6,410,463 | B1 | 6/2002 | Matsuki |
| 6,420,441 | B1 | 7/2002 | Allen et al. |
| 6,451,712 | B1* | 9/2002 | Dalton et al. ............... 438/781 |
| 6,486,082 | B1 | 11/2002 | Cho et al. |
| 6,495,479 | B1* | 12/2002 | Wu et al. ................... 438/781 |
| 6,528,409 | B1 | 3/2003 | Lopatin et al. |
| 6,632,531 | B2 | 10/2003 | Blankenship |
| 6,670,285 | B2 | 12/2003 | Hawker et al. |
| 6,858,697 | B2 | 2/2005 | Mayorga et al. |
| 6,936,551 | B2* | 8/2005 | Moghadam et al. ........ 438/780 |
| 7,011,864 | B2* | 3/2006 | Ishida ....................... 427/240 |
| 7,056,560 | B2 | 6/2006 | Yim et al. |
| 7,060,330 | B2 | 6/2006 | Zheng et al. |
| 7,101,948 | B2 | 9/2006 | Mayorga et al. |
| 7,108,771 | B2 | 9/2006 | Xu et al. |
| 2002/0142579 | A1 | 10/2002 | Vincent et al. |
| 2003/0044531 | A1* | 3/2003 | Ishida ....................... 427/240 |
| 2003/0077918 | A1* | 4/2003 | Wu et al. ................... 438/781 |
| 2003/0124785 | A1* | 7/2003 | Xu et al. ................... 438/200 |
| 2003/0146451 | A1* | 8/2003 | Huang et al. ............... 257/200 |
| 2003/0232137 | A1 | 12/2003 | Vrtis et al. |
| 2004/0039219 | A1 | 2/2004 | Chen et al. |
| 2004/0071878 | A1* | 4/2004 | Schuhmacher et al. 427/255.28 |
| 2004/0087184 | A1* | 5/2004 | Mandal et al. .............. 438/781 |
| 2004/0102006 | A1 | 5/2004 | Xu et al. |
| 2004/0137243 | A1 | 7/2004 | Gleason et al. |
| 2005/0130404 | A1* | 6/2005 | Moghadam et al. ........ 438/623 |
| 2005/0181613 | A1* | 8/2005 | Xu et al. .................... 438/689 |
| 2005/0268849 | A1* | 12/2005 | Ishida ........................ 118/719 |

FOREIGN PATENT DOCUMENTS

| | | |
|---|---|---|
| EP | 1 321 469 A1 | 6/2003 |
| JP | 50-111198 A2 | 9/1975 |
| WO | WO -98/15499 A1 | 4/1998 |
| WO | WO-2004/027110 A2 | 4/2004 |

OTHER PUBLICATIONS

Laxman, Ravi K., et al., Synthesizing Low-K CVD Materials for Fab Use. Semiconductor International, Nov. 1, 2000.

Mantz, R.A., et al., Thermolysis of Polyhedral Oligomeric Silsesquioxane (POSS) Macromers and POSS-Siloxane Copolymers, Chem. Mater., Jun. 1996, pp. 1250-1259, vol. 8, No. 6.

Wang, Albert, et al., TMCTS for gate dielectric in thin films transistors, Mat Res. Soc. Meeting, 1996.

A. Grill, et al., "Ultralow-k dielectrics prepared by plasm-enhanced chemical vapor deposition" Applied Physics Letters, vol. 79, No. 6, pp. 803-805, date is not available.

* cited by examiner

POROGEN MATERIAL

This is a divisional of U.S. Ser. No. 10/301,109, filed on Nov. 21, 2002, now allowed herein incorporated by reference.

BACKGROUND

Embodiments described relate to inter layer dieletric (ILD) films. In particular, embodiments relate to K ILD films.

BACKGROUND OF THE RELATED ART

In the fabrication of semiconductor devices, various material layers are deposited on a semiconductor substrate. Each of the layers may be patterned and processed to perform various functions. For example, an inter-layer dielectric (ILD) film material may be deposited on a semiconductor substrate and patterned to form trenches therein. A metal based material may be deposited above the ILD and within the trenches. Subsequent processing may be employed to form circuit features in the form of parallel metal lines of the metal based material isolated by the ILD film.

In order to enhance performance of circuit features such as the noted parallel metal lines, a decrease in capacitance, and therefore electrical resistance, may be sought. In order to decrease capacitance the particular ILD employed to isolate the metal lines is often of a 'low k' character. That is, where capacitance (C) is k$\epsilon$A/d, with a permittivity constant ($\epsilon$), a distance (d) between the parallel metal lines, and an interfacing area (A) of the metal lines with respect to one another, capacitance (C) may be lowered where the dielectric constant (k) is reduced. As semiconductor features continue to become smaller and smaller, with the distance (d) continuing to be reduced, the use of 'low k' materials in order to reduce capacitance (C) is becoming increasingly important. Generally, a low k ILD may be an ILD with a dielectric constant (k) that is below about 4.

In order to form a low k ILD, the WLD material may be deposited on the semiconductor substrate and pores generated therein. That is, an ILD material such as silicon dioxide may mixed with an additional material, often referred to as a porogen, and deposited. The ILD may then be treated to remove the porogen such that pores are generated in the ILD at locations where the porogen has been removed. A lower k value is then associated with the ILD material layer as its overall porosity increases. However, the mixture of the porogen and the ILD is not necessarily consistent nor uniform. Rather, the fully formed ILD material layer is likely to have regions which are quite variable from one another in porosity. Therefore, the actual dielectric constant (k) may be quite variable from one portion of the ILD to another. This may potentially have an adverse affect on the performance of various circuit features such as the indicated parallel metal lines.

SUMMARY

In one embodiment a porogen material is provided. The porogen material may include a silicon containing porogen and a silicon based dielectric precursor.

In a method, the silicon based dielectric precursor and silicon containing porogen are delivered to a semiconductor substrate where the porogen material is formed as a film. The film may then be thermally annealed, such that uniform pores are generated.

DETAILED DESCRIPTION

While embodiments are described with reference to certain circuit features isolated by a porous dielectric film, embodiments may be applicable to any circuit feature to be isolated by a porous film formed in part by utilizing a porogen. Additionally, embodiments may be particularly useful when multiple circuit features are to be isolated by the same porous dielectric film.

Figure 1:
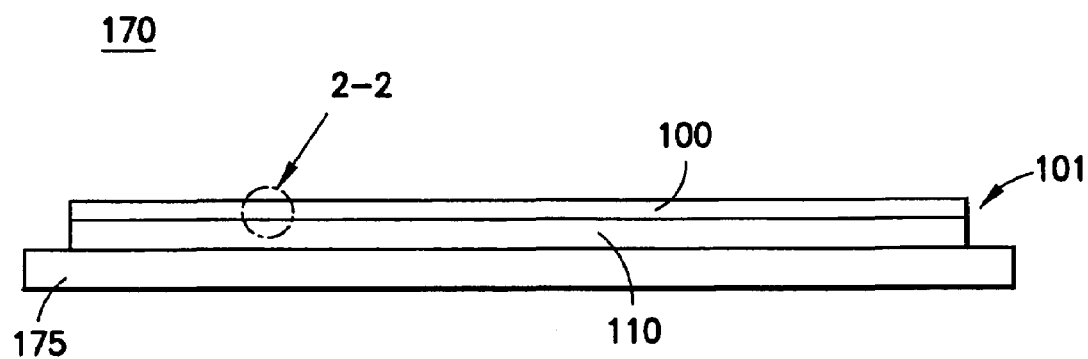
FIG. 1 is a side view of a semiconductor wafer having a porous film formed thereon.

Referring to FIG. 1, an embodiment of a semiconductor wafer 101 is shown. The semiconductor wafer 101 includes a substrate 110 which may be of monocrystalline silicon or other conventional semiconductor material. An embodiment of a porous film 100 is shown on the substrate 110. The porous film 100 is of substantially uniform porosity. As a result of the uniform porosity, a substantially uniform dielectric constant value is present throughout the porous film 100. As described further herein, the presence of such a uniform dielectric constant value throughout the porous film 100 helps to enhance the reliability of circuit features to be isolated by the material of the porous film 100.

The porous film 100 shown in FIG. 1 is formed by activating a porogen material deposited above the semiconductor wafer 101 to a porous state as described further herein. For example, heat may be applied through a susceptor 175 of a conventional semiconductor oven 170 in order to induce a chemical and physical change in the porogen material, such that it is transformed into the porous film 100 shown.

Embodiments of the porogen material described above may be delivered to the semiconductor wafer 101 by conventional means. For example, in one embodiment the semiconductor wafer 101 may be placed in a conventional chemical vapor deposition (CVD) apparatus where a gas mixture, including components of the porogen material and other filler gasses are introduced. Radio frequency (RF) may even be applied to provide plasma enhanced CVD (i.e. PECVD). Conventional pressures, RF, and temperatures, described further below, may be applied during delivery of the porogen material.

Figure 2:
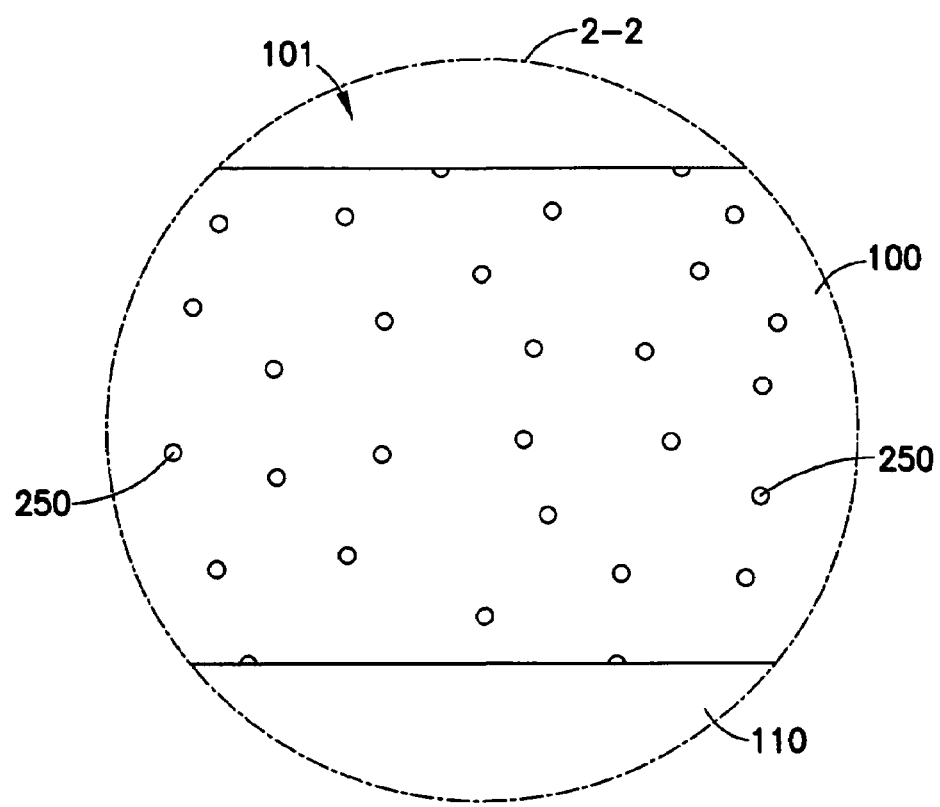
FIG. 2 is an exploded view of a portion of the semiconductor wafer taken from 2-2 of FIG. 1.

Continuing with reference to FIGS. 1 and 2, the porous film 100 is shown having substantially uniform porosity as noted above. That is, pores 250 are distributed fairly uniformly throughout the porous film 100. As described further herein, this will lead to a more uniform and predictable dielectric constant, and thus, more reliable device performance.

In order to ensure that the pores 250 are distributed substantially uniformly throughout the porous film 100, the porogen material itself is a composition of a silicon based dielectric precursor and a silicon containing porogen which chemically bond to one another when delivered to the semiconductor wafer 101 as described above. Thus, the silicon containing porogen is not randomly distributed, but rather is more uniformly associated with the silicon based dielectric precursor through chemical bonding. As a result, pores 250 formed by the silicon containing porogen will be more uniformly distributed as well.

Embodiments of the silicon based dielectric precursor may include tetramethylcyclotetrasiloxane (TMCTS), hexamethylcyclotetrasiloxane (HMCTS), octamethylcyclotetrasiloxane (OMCTS), and others. Preferably, the silicon based dielectric precursor will be a cyclic siloxane. The cyclic siloxane or other silicon based dielectric precursor may be delivered to the vicinity of a semiconductor wafer 101 where a silicon containing porogen is also delivered. As described above, this may be accomplished through conventional CVD or other deposition methods. In this manner, the silicon based dielectric precursor and the silicon containing porogen combine to form the porogen material noted above.

The silicon containing porogens of the porogen material may include a thermally cleavable organic group. In one embodiment the porogen material is thermally activated to release the thermally cleavable organic group, leaving behind a pore 250 such as those shown in FIG. 2. Such silicon containing porogens may include carboxylates with alkyl, fluoroalkyl, perfluoroalkyl, cycloalkyl, aryl, fluoroaryl, vinyl, allyl, or other side chains. In other embodiments, silicon containing porogens may include a thermally cleavable side chain which is a tertiary alkyl group, such as a t-butyl or amyl group. The particular silicon containing porogen employed is a matter of design choice depending on factors such as compatibility with the silicon based dielectric precursor, the size and amount of pores 250 to be formed, and the desired parameters to be employed in activating the porogenesis.

Continuing again with reference to FIGS. 1 and 2, the semiconductor wafer 101 is shown on a susceptor 175 of a conventional semiconductor bake oven 170. In one embodiment, the susceptor 175 heats the semiconductor wafer 101 changing the porogen material into the porous film 100 with substantially uniformly distributed pores 250 as shown in FIG. 2. The heat provided by the susceptor 175 may be between about 100° C. and about 450° C., preferably below about 400° C. However, the exact temperature applied as well as the amount of time heat is applied are a matter of design choice. For example, where increased porosity and a lower dielectric constant value are paramount, the time and extent of heat application will similarly be higher. However, give the same porogen material, if durability of the semiconductor wafer 101 is at issue, less heat may be applied for a shorter amount of time resulting in a lower level of overall porosity.

Of course, the overall level of porosity to be activated may be particularly tailored by the exact composition of the porogen material itself in addition to parameters such as temperature utilized in activating the porogenesis. Regardless of the degree of porosity formed, the pores 250 will remain substantially uniformly distributed throughout the porous film 100.

With reference to FIGS. 3A-3D, the formation of metal lines 392 isolated by a porous film 300 is discussed in detail. The embodiments described with reference to FIGS. 3A-3E describe the formation of particular circuit features (metal lines 392) isolated by the porous film 300. However, additional circuit features may be formed and isolated by the porous film 300. Additionally, FIG. 4 is a flow chart summarizing embodiments of forming a metal lines 392 in a semiconductor wafer 301 as described in FIGS. 3A-3D. Therefore, FIG. 4 is referenced throughout remaining portions of the description as an aid in describing the embodiments referenced in FIGS. 3A-3D.

Figure 3A:
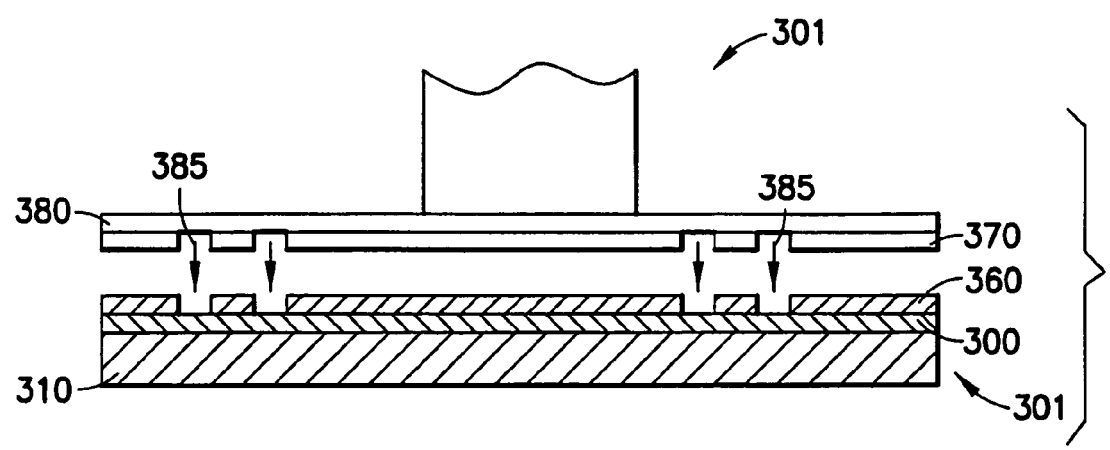
FIG. 3A is a side cross-sectional view of a semiconductor wafer having a patterned photoresist formed above a porous film.
Figure 4:
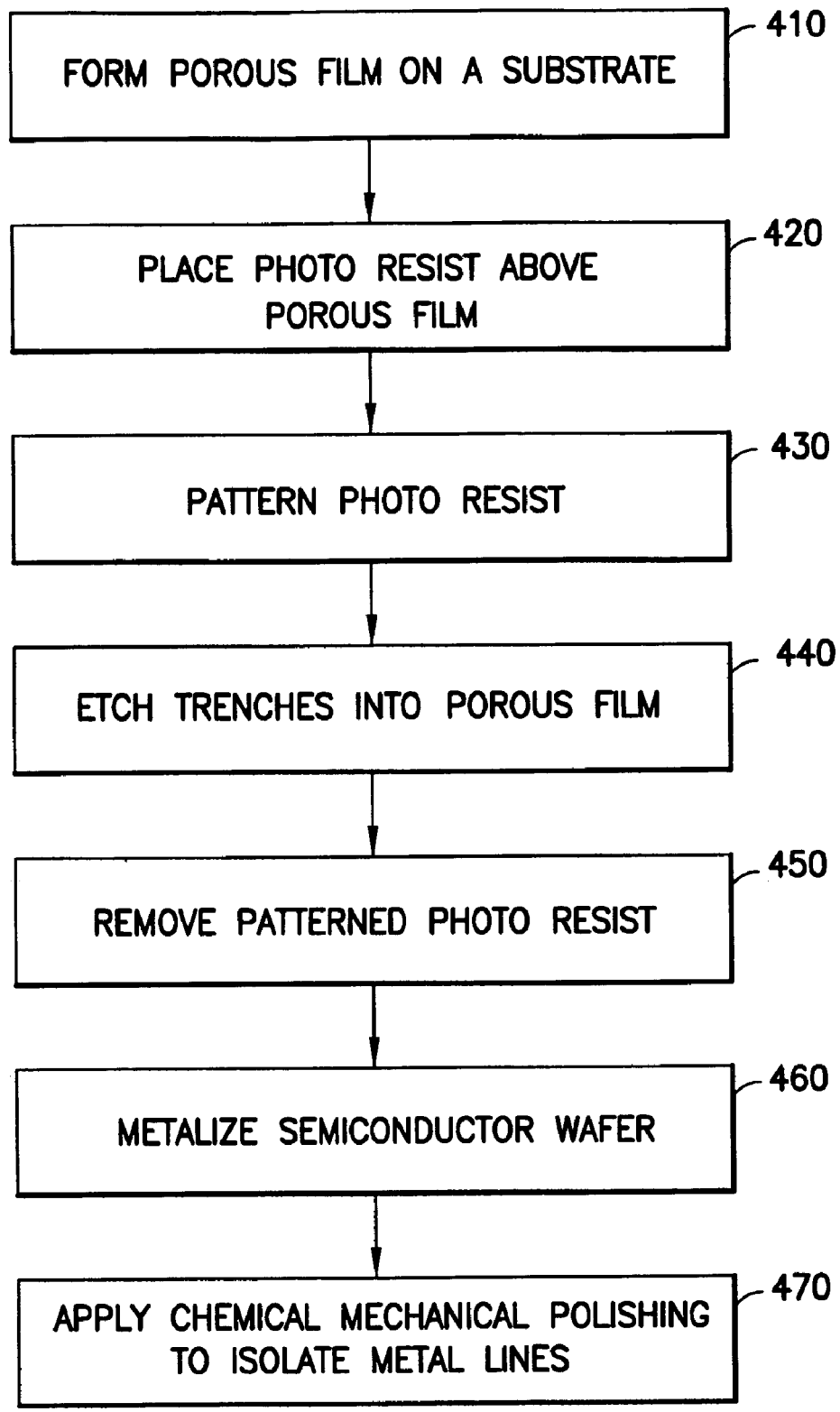
FIG. 4 is a flow chart summarizing embodiments of isolating patterned semiconductor circuitry with a porous silicon based dielectric composition.

Referring now to FIG. 3A, a semiconductor wafer 301 is shown having a porous film 300 formed on a substrate 310 thereof as indicated at 410 of FIG. 4. The porous film 300 is formed according to methods described above with reference to FIGS. 1 and 2 and includes a substantially uniform porosity and dielectric constant value throughout.

As shown at 420 of FIG. 4, a chemically resilient photo resist 360 is placed above the porous film 300. The photo resist 360 is then patterned as indicted at 430 with a photomasking tool 301 as shown in FIG. 3A. In the embodiment shown, the photo resist 360 is subject to deterioration upon exposure to certain conditions such as ultraviolet (UV) light. Therefore, in order to pattern the photo resist 360, the photomasking tool 301 includes UV emitting portions 385 defined and contained by a mask 370. In this manner the photomasking tool 301 may be applied to pattern the photo resist 360 as shown in FIG. 3A.

Figure 3B:
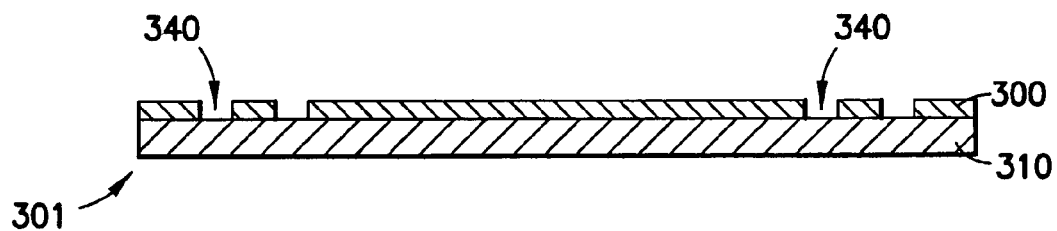
FIG. 3B is a side cross-sectional view of the semiconductor wafer of FIG. 3A having trenches formed in the porous film.

Conventional etching techniques may follow the patterning of the photo resist 360. That is, as indicated at 440 of FIG. 4., conventional chemical etchants may be delivered to the semiconductor wafer 301 to form trenches 340 in the porous film 300. The patterned photo resist 360 protects the porous film 300 where present. However, the patterning described above, allows chemical etchants to reach the porous film 300 at certain locations where the trenches 340 are formed. Once the trenches 340 are formed, the patterned photo resist 360 may be removed as indicated at 450 of FIG. 4. This may be achieved for example by further exposure to UV light, leaving the semiconductor wafer 301 as shown in FIG. 3B.

Figure 3C:
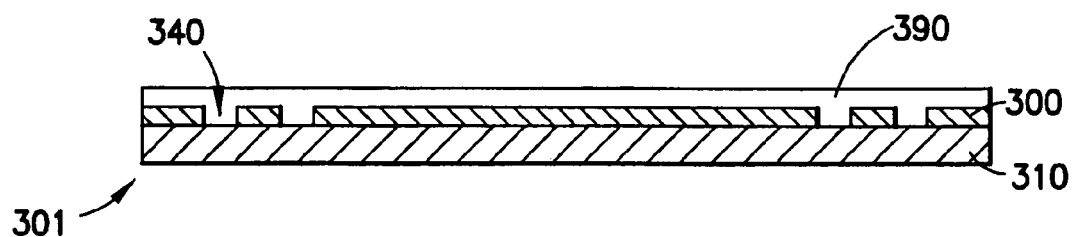
FIG. 3C is a side cross-sectional view of the semiconductor wafer of FIG. 3B following metalization.

Referring to FIG. 3C and 4, the semiconductor wafer 301 is metalized as indicated at 460. For example, copper, aluminum, or other electrically conductive material may be deposited above the substrate 310 and porous film 300 while filling the trenches 340. This may be achieved by conventional techniques such as CVD described above. The resulting metal layer 390 remains to be isolated and formed into independent circuit features as described below.

Figure 3D:
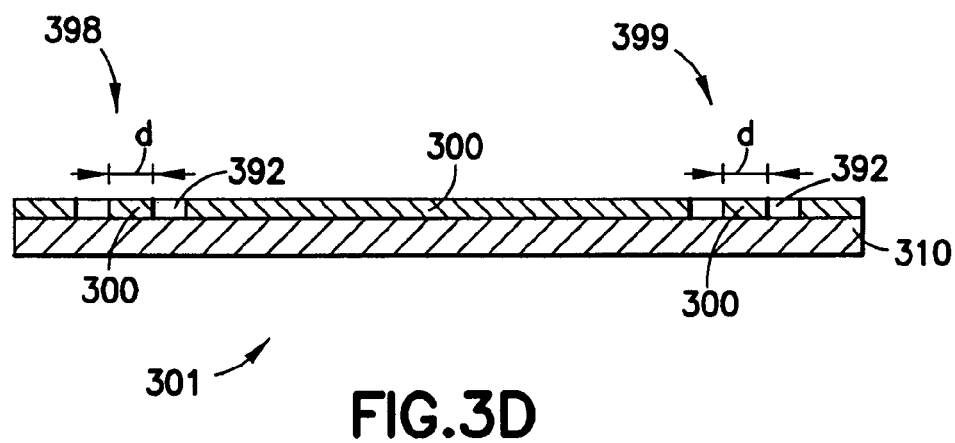
FIG. 3D is a side cross-sectional view of the semiconductor wafer of FIG. 3C following application of chemical mechanical polishing to isolate pairs of metal lines.

Referring to FIG. 3D the semiconductor wafer 301 is shown following the application of conventional chemical mechanical polishing (CMP) to isolate circuit features in the form of metal lines 392 as indicated at 470 of FIG. 4. That is, a chemical slurry is delivered, and a rotating polishing pad applied, to the semiconductor wafer 301 until the metal lines 392 are left isolated by the porous film 300.

Continuing with reference to FIG. 3D, a first pair 398 of metal lines 392 at one location of the semiconductor wafer 301 may be compared to a second pair 399 at another location. Each pair 398, 399 includes metal lines 392 separated by porous film 300 of a distance (d). While the pairs 398, 399 are located in entirely different areas of the semiconductor wafer 301, the porous film 300, formed according to methods described herein, is of substantially uniform porosity throughout.

From on portion of the porous film 300 to another, the dielectric constant (k) value remains substantially consistent. That is, the dielectric constant (k) value for the first pair 398 of metal lines 392 is substantially equivalent to the dielectric constant value (k) for the second pair 399. As a result, capacitance (C) (which is kεA/d) is less variable even as the dielectric constant (k) is lowered by the addition of a porosity. Resulting circuit features, such as the metal lines 392, isolated by the porous film 300, therefore perform in a more reliable and predictable manner. Further processing may follow wherein the semiconductor wafer 301 is sawed into individual dice for integrated circuits with individual circuit features. Nevertheless consistent performance may be expected from semiconductor devices employing such integrated circuits.

Embodiments of the invention include a porous dielectric film having a substantially uniform level of porosity throughout. Although exemplary embodiments describe particular circuit features isolated by a porous film additional embodiments are possible. Many changes, modifications, and substitutions may be made without departing from the spirit and scope of these embodiments.

We claim:

1. A semiconductor wafer comprising a substrate, and metal lines on the substrate, wherein the metal lines are isolated from one another by a dielectric film, and the dielectric film comprises a cyclic siloxane having chemically bonded thereto a silicon containing porogen, wherein said silicon containing porogen includes a thermally cleavable organic group adapted to form a pore in the dielectric film when thermally cleaved.

2. The semiconductor wafer according to claim 1, wherein the cyclic siloxane comprises a siloxane compound selected from among tetramethylcyclotetrasiloxane (TMCTS), hexamethylcyclotetrasiloxane (HMCTS), and octamethylcyclotetrasiloxane (OMCTS).

3. The semiconductor wafer according to claim 2, wherein the silicon containing porogen comprises a porogen selected from among (i) silicon carboxylate compounds comprising a side chain selected from among alkyl, fluoroalkyl, perfluoroalkvl, cycloalkyl, arvl, fluoroaryl, vinyl, and allyl, and (ii) silicon compounds including a tertiary alkyl side chain.

4. The semiconductor wafer according to claim 3, wherein the tertiary alkyl side chain comprises a t-butyl or amyl group.

5. The semiconductor wafer according to claim 4, wherein the metal lines comprise a metal selected from among copper and aluminum.

6. The semiconductor wafer according to claim 1, wherein the silicon containing porogen comprises a porogen selected from among (i) silicon carboxylate compounds comprising a side chain selected from among alkyl, fluoroalkyl, perfluoroalkyl, cycloalkyl, aryl, fluoroaryl, vinyl, and allyl, and (ii) silicon compounds including a tertiary alkyl side chain.

7. The semiconductor wafer according to claim 6, wherein the tertiary alkyl side chain comprises a t-butyl or amyl group.

8. The semiconductor wafer according to claim 1, wherein the metal lines comprise a metal selected from among copper and aluminum.

9. A semiconductor wafer comprising a substrate, and metal lines on the substrate, wherein the metal lines are isolated from one another by a dielectric film, and the dielectric film comprises a cyclic siloxane having chemically bonded thereto a silicon containing porogen, wherein said silicon containing porogen includes a thermally cleavable organic group adapted to form a pore in the dielectric film when thermally cleaved, wherein the cyclic siloxane comprises a siloxane compound selected from among tetramethylcyclotetrasiloxane (TMCTS), hexamethylcyclotetrasiloxane (HMCTS), and octamethylcyclotetrasiloxane (OMCTS), wherein the silicon containing porogen comprises a porogen selected from among (i) silicon carboxylate compounds comprising a side chain selected from among alkyl, fluoroalkvl, perifluoroalkyl, cycloalkyl, aryl, fluoroaryl, vinyl, and allyl. and (ii) silicon compounds including a tertiary alkyl side chain selected from among t-butyl and amyl, and wherein the metal lines comprise a metal selected from among copper and alummuni.

* * * * *

UNITED STATES PATENT AND TRADEMARK OFFICE
CERTIFICATE OF CORRECTION

PATENT NO.        : 7,342,295 B2                                     Page 1 of 1
APPLICATION NO. : 11/071621
DATED             : March 11, 2008
INVENTOR(S)       : Chongying Xu It is certified that error appears in the above-identified patent and that said Letters Patent is hereby corrected as shown below:

Title page, first column, Notice field, "Subject to any disclaimer, the term of this patent is extended or adjusted under 35 U.S.C. 154(b) by 53 days" should be -- Subject to any disclaimer, the term of this patent is extended or adjusted under 35 U.S.C. 154(b) by 173 days --.

Title page, second column, References Cited, Other Publications, first entry, "Novel low-k dual-phase materials pepared" should be -- Novel low-k dual-phase materials prepared --.

Column 1, line 40, "the WLD material" should be -- the ILD material --.

Column 5, line 41 (claim 3), "fluoroalkvl, cylcloalkyl, arvl" should be -- fluoroalkyl, cylcloalkyl, aryl --.

Column 6, line 36 (claim 9), "alkyl, fluoroalkvl, perifluoroalkyl" should be -- alkyl, fluoroalkyl, perfluoroalkyl --.

Signed and Sealed this

Twenty-eighth Day of April, 2009

JOHN DOLL
*Acting Director of the United States Patent and Trademark Office*